(12) United States Patent
Shah et al.

(10) Patent No.: US 12,721,159 B2
(45) Date of Patent: Aug. 25, 2026

(54) STRUCTURAL THERMAL INTERFACING FOR LIDDED SEMICONDUCTOR PACKAGES

(71) Applicant: ADVANCED MICRO DEVICES, INC., Santa Clara, CA (US)

(72) Inventors: Priyal Shah, Santa Clara, CA (US); Raja Swaminathan, Austin, TX (US); Brett P. Wilkerson, Austin, TX (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 603 days.

(21) Appl. No.: 17/554,498

(22) Filed: Dec. 17, 2021

(65) Prior Publication Data

US 2022/0199429 A1 Jun. 23, 2022

Related U.S. Application Data

(60) Provisional application No. 63/127,443, filed on Dec. 18, 2020.

(51) Int. Cl.

*H10W 40/00* (2026.01)
*H10W 40/22* (2026.01)
*H10W 40/25* (2026.01)
*H10W 40/70* (2026.01)
*H10W 74/01* (2026.01)
*H10W 90/00* (2026.01)

(52) U.S. Cl.

CPC ......... *H10W 40/037* (2026.01); *H10W 40/22* (2026.01); *H10W 40/251* (2026.01); *H10W 40/70* (2026.01); *H10W 74/016* (2026.01); *H10W 90/00* (2026.01)

(58) Field of Classification Search

None

See application file for complete search history.

(56) References Cited

U.S. PATENT DOCUMENTS 11,810,833 B2 * 11/2023 Hung ................ H01L 21/67092

* cited by examiner

*Primary Examiner* — Jack S Chen

(57) ABSTRACT

Structural thermal interfacing for lidded semiconductor packages, including: applying, to a periphery of a surface of a chip, a stiffening adhesive framing a center portion of the chip; applying, to the center portion of the chip, a thermal interface material; and applying a lid to the chip, wherein the lid contacts the stiffening adhesive and is thermally coupled to the chip via the thermal interface material after application to the chip.

16 Claims, 6 Drawing Sheets

STRUCTURAL THERMAL INTERFACING FOR LIDDED SEMICONDUCTOR PACKAGES

BACKGROUND

Lidded semiconductor packages use a thermally conductive lid to cover a die or chip module bonded to a substrate. The chip module is thermally coupled to the lid using a thermal interface material to allow heat to transfer from the chip module to the lid. Heat is then transferrable from the lid to a cooling element such as a heat sink, a fan, and the like. Where heat will be applied to a seated chip package to allow for solder reflow, a non-metallic thermal interface material is used such as grease, graphite or other polymer based thermal interface material. Such non-metallic thermal interface materials are compliant and therefore may not provide structural support for the semiconductor package. Where there is a mismatch in the coefficients of thermal expansion for the components (e.g., the substrate, the chip module, or the lid), delamination produces air gaps between the components, reducing the efficacy of thermal transfer between the chip module and the lid.

DETAILED DESCRIPTION

Lidded semiconductor packages use a thermally conductive lid to cover a die or chip module bonded to a substrate. The chip module is thermally coupled to the lid using a thermal interface material to allow heat to transfer from the chip module to the lid. Heat is then transferrable from the lid to a cooling element such as a heat sink, a fan, and the like. Where heat will be applied to a seated chip package to allow for solder reflow, a non-metallic thermal interface material is used such as grease, graphite or other polymer based thermal interface material. Such non-metallic thermal interface materials are compliant and therefore may not provide sufficient structural support for the semiconductor package.

Figure 1A:
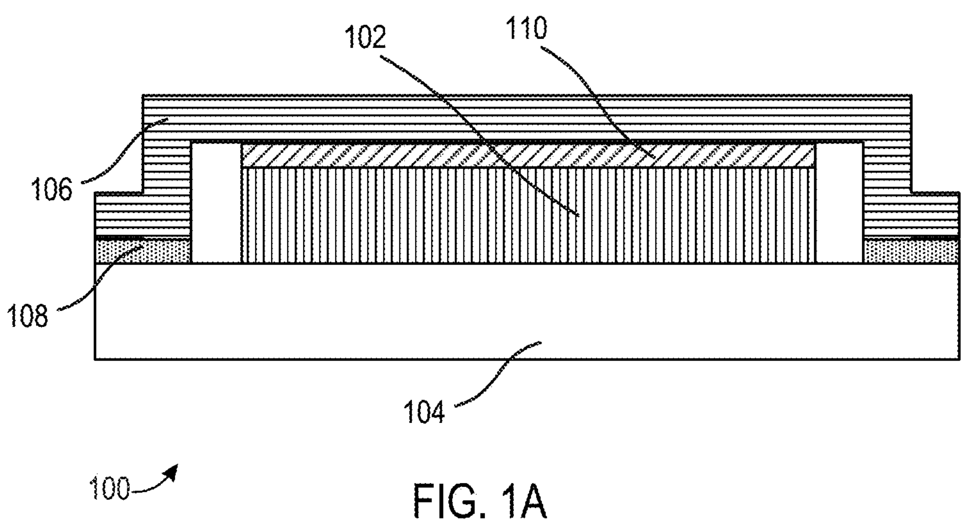
FIG. 1A is a diagram of an example semiconductor package.

As an example, FIG. 1A shows a cross section view of an example semiconductor package 100 according to implementations known in the art. The semiconductor package 100 of FIG. 1A includes a chip 102 bonded to a substrate 104. The chip 102 includes one or more dies (e.g., silicon dies). The substrate 104 includes, for example, a circuit board, a printed circuit board, and the like. In some implementations, the chip 102 is bonded to the substrate 104 by being seated in a socket or other interface in the substrate 104. In some implementations, the chip 102 is bonded to the substrate 104 through one or more direct conductive couplings.

A lid 106 covers the chip 102. The chip 102 includes one or more dies, with each die including blocks of semiconducting material such as silicon onto which a given functional circuit block is fabricated. The lid 106 is made of a thermally conductive metal such as copper. In the example semiconductor package 100, the lid 106 is bonded to the substrate 104 using an adhesive 108. The chip 102 is thermally coupled to the lid 106 by a portion of thermal interface material 110. The thermal interface material 110 is a thermally conductive material that fills air gaps between a surface of the chip 102 and an inner surface of the lid 106. For example, the thermal interface material 110 includes a thermal paste, a thermal grease, graphite preforms, and the like.

Figure 1B:
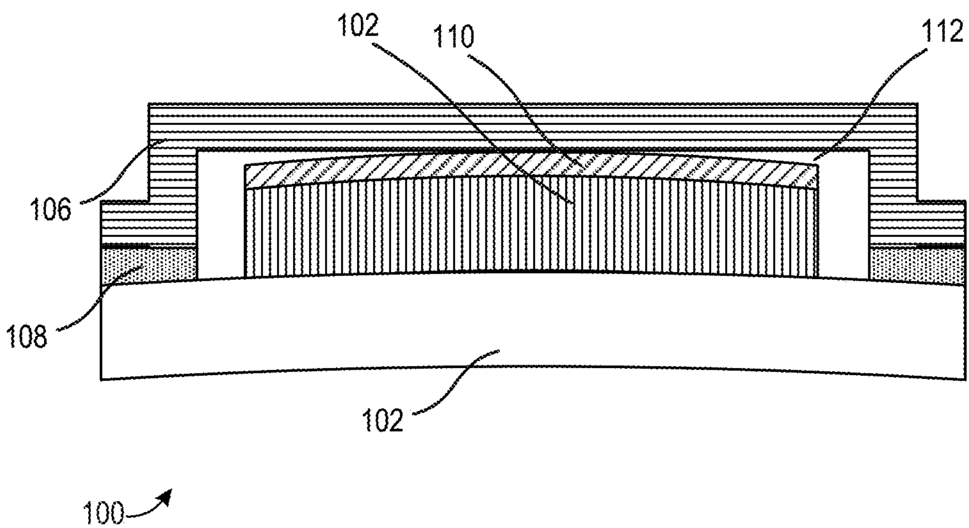
FIG. 1B is a diagram of an example semiconductor package.

During use of the semiconductor package 100 in a device, heat is produced. The thermal interface material 110, such as a polymer thermal interface material 110, remains compliant after application. Accordingly, under some circumstances, the thermal interface material 110 fails to provide strong structural support for the chip 102 relative to the lid 106. In some circumstances where there is a mismatch in the coefficients of thermal expansion for the components (e.g., the substrate 104, the chip 102, or the 106), under a temperature exposure, the chip 102 warps relative to the lid 106 due to insufficient coupling between the chip 102 and the lid 106. Accordingly, delamination produces air gaps between the components, reducing the efficacy of thermal transfer between the chip 102 and the lid 106. As is shown in FIG. 1B, a deformation caused by heat and differing coefficients of thermal expansion causes delamination, thereby producing gaps 112. In this example, the gaps 112 are formed between the thermal interface material 110 and the lid 106. One skilled in the art will appreciate that, in other examples, gaps 112 are formed in different areas depending on the particular deformations, such as between the chip 102 and the thermal interface material 110 still contacting the lid 106. Such gaps 112 reduce the efficacy of thermal transfer between the chip 102 and the lid 106 as air is less thermally conductive than the thermal interface material.

To that end, the present specification sets forth various implementations for structural thermal interfacing for lidded semiconductor packages. In some implementations, a method of structural thermal interfacing for lidded semiconductor packages includes: applying, to a periphery of a surface of a chip, a stiffening adhesive framing a center portion of the chip; applying, to the center portion of the chip, a thermal interface material; and applying a lid to the chip, wherein the lid contacts the stiffening adhesive and is thermally coupled to the chip via the thermal interface material after application to the chip.

In some implementations, the thermal interface material includes a non-metallic thermal interface material. In some implementations, the thermal interface material includes a polymer thermal interface material. In some implementations, the method further includes curing the stiffening adhesive. In some implementations, the stiffening adhesive, after curing, forms a rigid frame around the center portion of the chip. In some implementations, the method further includes: applying, to a periphery of a surface of another chip, another stiffening adhesive framing a center portion of the other chip; applying, to the center portion of the other chip, another thermal interface material; and wherein applying the lid comprises applying the lid to the chip and the other chip. In some implementations, the chip includes a plurality of dies at least partially encapsulated in an encapsulant; wherein the stiffening adhesive is applied to a portion of the encapsulant defining the periphery of the surface of the chip.

The present specification also describes various implementations of a semiconductor package for structural thermal interfacing for lidded semiconductor packages. Such a semiconductor package includes: a substrate; a chip bonded to the substrate; and a lid, wherein the lid is bonded to the chip by a stiffening adhesive framing a center portion of the chip, and wherein the lid is thermally coupled to the chip by a thermal interface material.

In some implementations, the thermal interface material includes a non-metallic thermal interface material. In some implementations, the thermal interface material includes a polymer thermal interface material. In some implementations, the stiffening adhesive forms a rigid frame around the center portion of the chip. In some implementations, the semiconductor package further includes another chip bonded to the substrate; wherein the lid is bonded to the other chip by another stiffening adhesive framing a center portion of the other chip, and wherein the lid is thermally coupled to the other chip by another thermal interface material. In some implementations, the chip includes a plurality of dies at least partially encapsulated in an encapsulant, and wherein the stiffening adhesive is applied to a portion of the encapsulant defining the periphery of the surface of the chip. In some implementations, the lid is bonded to the substrate by another adhesive.

Also described in this specification are various implementations of an apparatus for structural thermal interfacing for lidded semiconductor packages. Such an apparatus includes computer memory; a chip operatively coupled to the computer memory; and a lid, wherein the lid is bonded to the chip by a stiffening adhesive framing a center portion of the chip, and wherein the lid is thermally coupled to the chip by a thermal interface material.

In some implementations, the thermal interface material includes a non-metallic thermal interface material. In some implementations, the thermal interface material includes a polymer thermal interface material. In some implementations, wherein the stiffening adhesive forms a rigid frame around the center portion of the chip. In some implementations, the apparatus further includes another chip bonded to the substrate; wherein the lid is bonded to the other chip by another stiffening adhesive framing a center portion of the other chip, and wherein the lid is thermally coupled to the other chip by another thermal interface material. In some implementations, the chip includes a plurality of dies at least partially encapsulated in an encapsulant, and wherein the stiffening adhesive is applied to a portion of the encapsulant defining the periphery of the surface of the chip.

The following disclosure provides many different implementations, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows include implementations in which the first and second features are formed in direct contact, and also include implementations in which additional features be formed between the first and second features, such that the first and second features are not in direct contact. Further, spatially relative terms, such as "beneath," "below," "lower," "above," "upper," "back," "front," "top," "bottom," and the like, are used herein for ease of description to describe one element or feature's relationship to another element(s) or feature(s) as illustrated in the figures. Similarly, terms such as "front surface" and "back surface" or "top surface" and "back surface" are used herein to more easily identify various components, and identify that those components are, for example, on opposing sides of another component. The spatially relative terms are intended to encompass different orientations of the device in use or operation in addition to the orientation depicted in the figures.

Figure 2A:
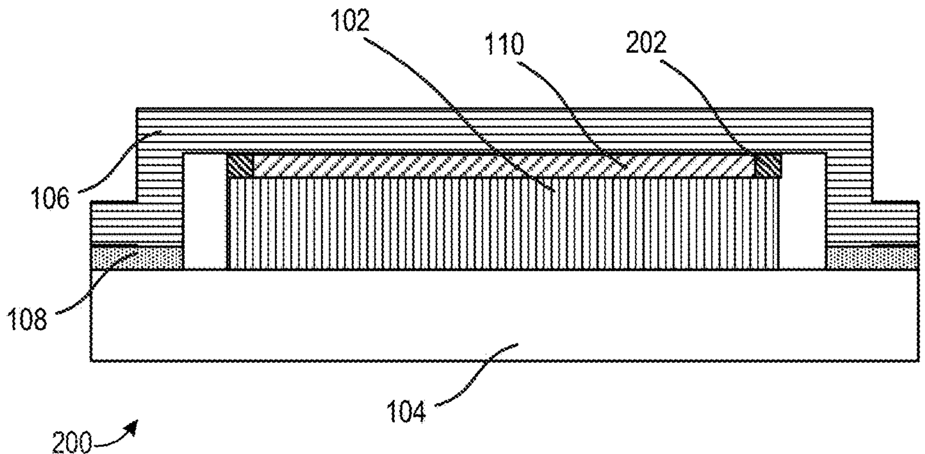
FIG. 2A is a diagram of an example semiconductor package for structural thermal interfacing for lidded semiconductor packages according to some implementations.

FIG. 2A is a cross-sectional view of a non-limiting example semiconductor package 200. The example semiconductor package 200 can be implemented in a variety of computing devices, including mobile devices, personal computers, peripheral hardware components, gaming devices, set-top boxes, and the like. Similar to the semiconductor package 100 of FIG. 1A, the semiconductor package 200 includes a chip 102 bonded to a substrate 104. The chip 102 includes one or more dies, which are blocks of semiconducting material such as silicon onto which a given functional circuit block is fabricated. In some implementations, the chip 102 is operatively coupled to other components of an apparatus via the substrate 104, such as computer memory, peripheral components, and the like. The chip 102 is covered or enclosed by a lid 106. The lid 106 is bonded to a substrate 104 using an adhesive 108 or other bonding or coupling mechanism as can be appreciated.

In contrast to the semiconductor package 100 of FIG. 1A, the chip 102 of the semiconductor package 200 of FIG. 2A is bonded to the inner surface of the lid 106 using a stiffening adhesive 202. The stiffening adhesive 202 is an adhesive compound that, after curing, forms a hardened (or relatively stiffer compared to polymer TIM) adhering bond between the chip 102 and the lid 106. The stiffening adhesive 202 is applied around a periphery of the chip 102. In some implementations the stiffening adhesive 202 forms a frame around a center portion of a surface of the chip 102. In some implementations, the stiffening adhesive is applied to a fewer than all sides of the periphery of the chip 102. Thus, after curing, the stiffening adhesive 202 forms a stiffened ring or frame that adheres the lid 106 to the chip 102. The thermal interface material 110 is applied to the center portion of the surface of the chip 102 that is framed by the stiffening adhesive 202. Thus, after curing, the stiffening adhesive 202 effectively frames the applied portion of the thermal interface material 110.

As the stiffening adhesive 202 is hardened after curing, the stiffening adhesive 202 provides structural support for the chip 102 relative to the lid 106. Thus, the stiffening adhesive 202 provides resistance against warping caused by thermal expansion during operation of the semiconductor package 200, thereby reducing the risk of delamination. As the stiffening adhesive 202 frames the center portion of the chip 102 to which the thermal interface material 110 is applied, the thermal interface material 110 has adequate surface area to perform thermal transfer between the chip 102 and the lid 106.

Figure 2B:
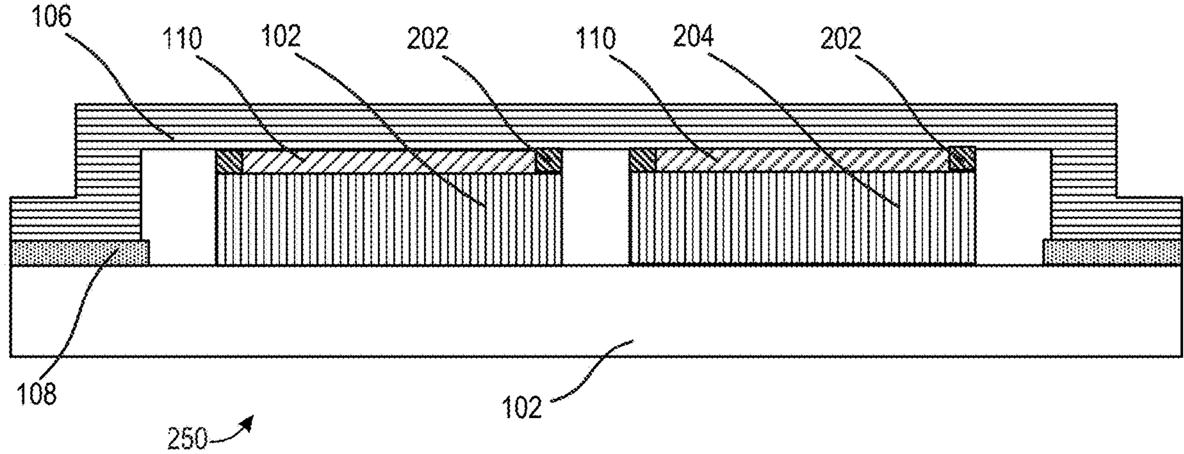
FIG. 2B is a diagram of an example semiconductor package for structural thermal interfacing for lidded semiconductor packages according to some implementations.

FIG. 2B shows a cross sectional view of another semiconductor package 250 according to some implementations of the present disclosure. Similar to FIG. 2A, the semiconductor package of FIG. 2B includes a chip 102 bonded to a substrate 104 enclosed by a lid 106 adhered to the substrate by an adhesive 108. Also similar to FIG. 2A, the chip 102 is thermally coupled to the lid 106 using a portion of thermal interface material 110 framed by a portion of stiffening adhesive 202 applied to a peripheral of the chip 102.

FIG. 2B differs from FIG. 2A in that another chip 204 is bonded to the substrate 104. The chip 204 is similar to the chip 102 in that the die chip includes one or more dies (e.g., silicon dies). FIG. 2B further differs from FIG. 2A in that the lid 106 covers or encloses both the chip 102 and the chip 204. The chip 204 is thermally coupled to the lid 106 using another portion of thermal interface material 110. The chip 204 is bonded to the lid 106 using another portion of stiffening adhesive 202 applied to the periphery of the chip 204. Thus, portions of stiffening adhesive 202 applied to both the chip 102 and chip 204 provide structural support relative to the lid 106 during thermal expansion due to heat produced during operation of the semiconductor package 250.

One skilled in the art will appreciate that the structural support provided by the stiffening adhesive 202 provides advantage over existing structural support solutions, such as stiffener rings, in that the stiffening adhesive 202 resists warping or movement of the chips 102, 204 relative to the lid, in contrast to stiffener rings which does not have the plate bonded to the back side of the die to provide additional structural support.

Figure 3A:
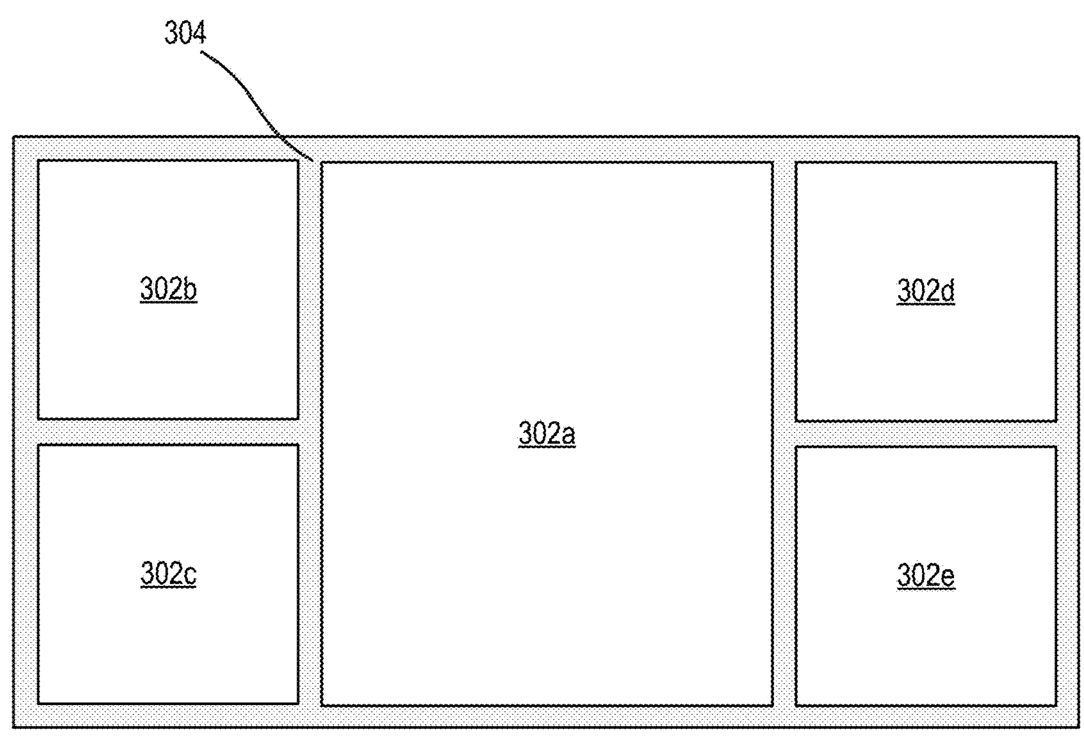
FIG. 3A is an example view of structural thermal interfacing for lidded semiconductor packages according to some implementations.
Figure 3B:
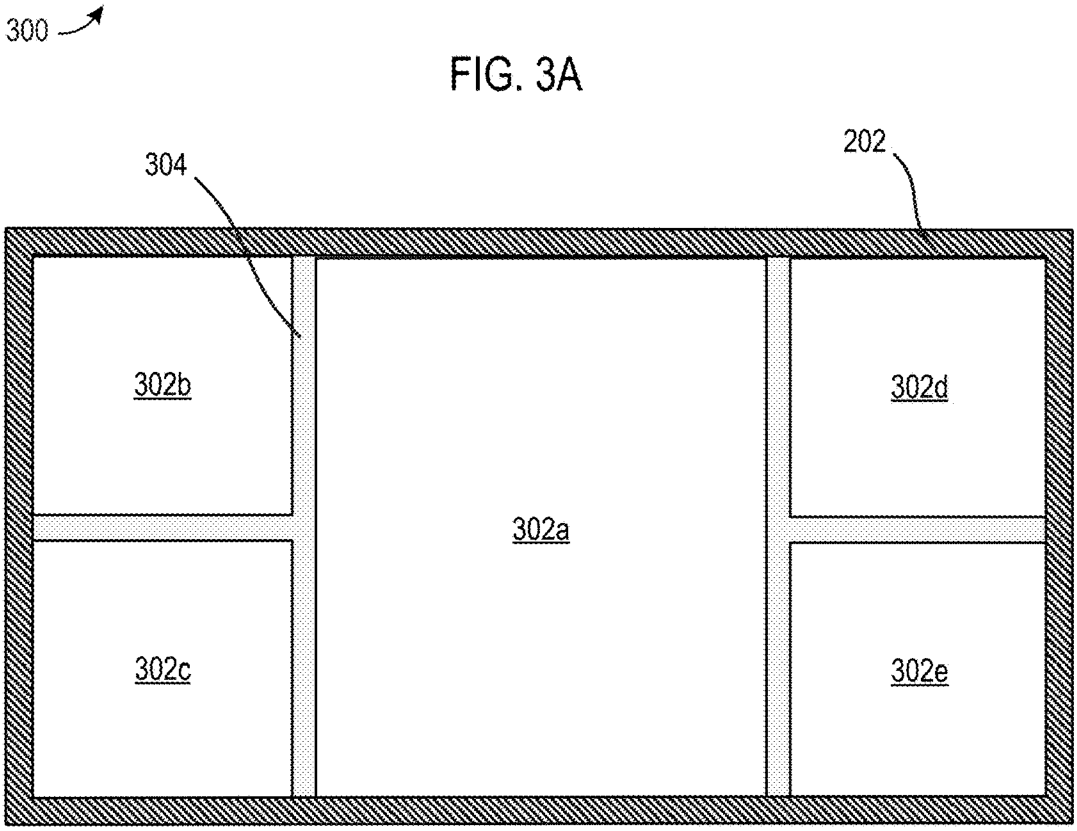
FIG. 3B is an example view of structural thermal interfacing for lidded semiconductor packages according to some implementations.
Figure 3C:
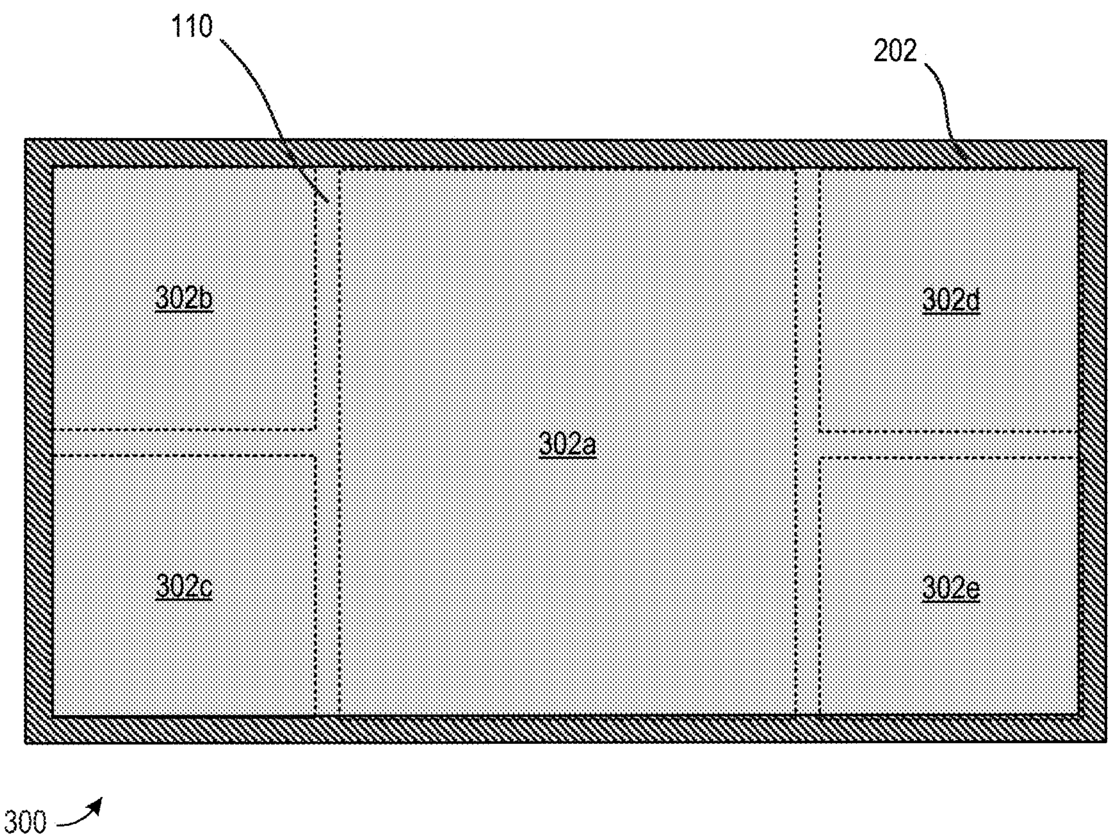
FIG. 3C is an example view of structural thermal interfacing for lidded semiconductor packages according to some implementations.

FIGS. 3A-3C show view of an application of stiffening adhesive 202 and thermal interface material to a chip 300 for structural thermal interfacing for lidded semiconductor packages according to some implementations of the present disclosure. As shown in FIG. 2A, the chip 300 includes multiple dies 302*a,b,c,d,e*. As an example, the dies 302*a-e* include blocks of semiconducting material such as silicon onto which a given functional circuit block is fabricated, such as chiplets, system-on-chip (SoC) dies, and the like. One skilled in the art will appreciate that the particular layout and arrangement of the dies 302*a-e* is merely exemplary, and that other layouts and configurations of dies 302*a-e*, including the addition or removal of dies 30*a-e*, are also contemplated within the scope of the present disclosure. The dies 302*a-e* are each surrounded by a portion of encapsulant 304. The encapsulant 304 is a molding material such as polyamide that provides structural support for the dies 302*a-e* and fixes the dies 302*a-e* in place.

As shown in FIG. 3B, a portion of stiffening adhesive 202 is applied to the periphery of the chip 300 in that the stiffening adhesive 202 is applied to each edge of the chip 300 to form a frame around a center portion of a surface of the chip 300. The stiffening adhesive 202 is applied to the encapsulant 304 that surrounds the dies 302*a-e*. One skilled in the art will appreciate that, in some implementations, the stiffening adhesive 202 will at least partially encroach on the surface of the dies 302*a-e* after application to the encapsulant 304, and particularly after application of a lid 106 that will cause some spreading of the stiffening adhesive 202 prior to curing.

As shown in FIG. 3C, the thermal interface material 110 is applied to the center portion of the surface of the chip 300 framed by the stiffening adhesive 202. One skilled in the art will appreciate that, in some implementations, the thermal interface material 110 is applied to the surface of the chip 300 prior to application of the stiffening adhesive 202. The stiffening adhesive 202 is then applied to frame the applied portions of thermal interface material 110.

Figure 4:
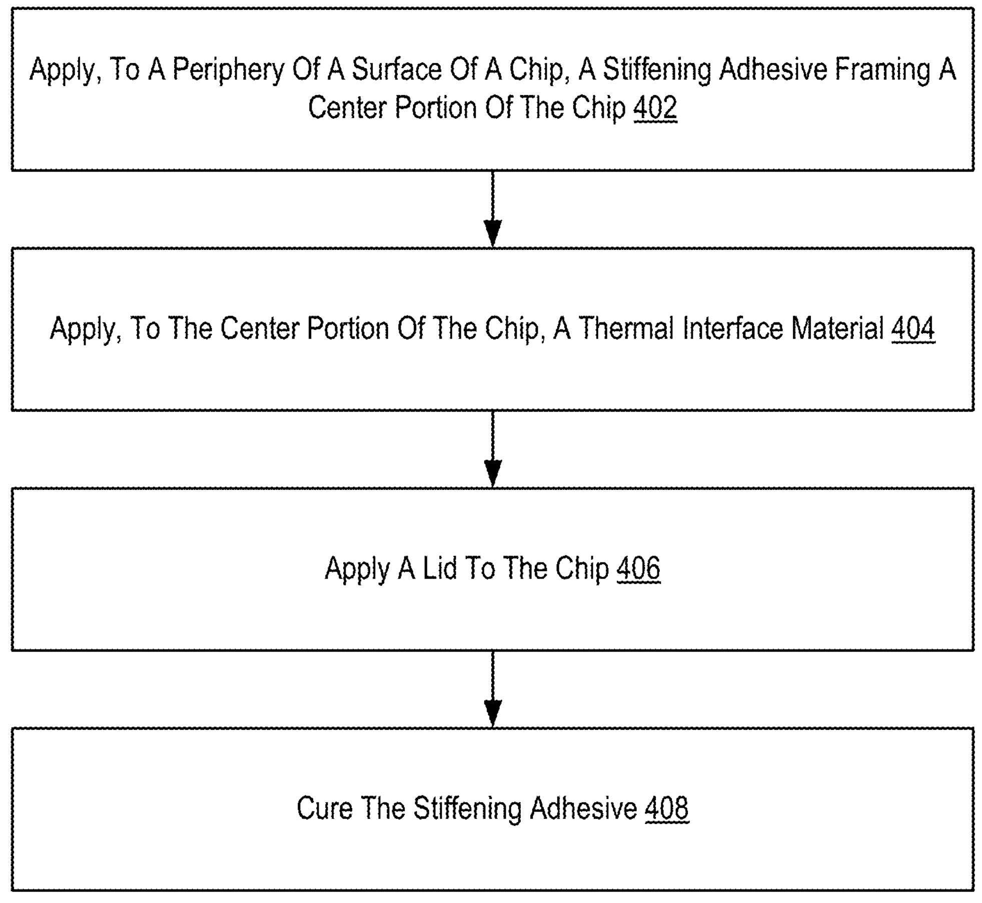
FIG. 4 is a flowchart of an example method for structural thermal interfacing for lidded semiconductor packages according to some implementations.

For further explanation, FIG. 4 sets forth a flow chart illustrating an example method for structural thermal interfacing for lidded semiconductor packages that includes applying 402, to a periphery of a surface of a chip (e.g., a chip 102,204,300) a stiffening adhesive 202 framing a center portion of the chip. The stiffening adhesive 202 is applied to the periphery of the chip 102,204,300 in that the stiffening adhesive 202 is applied to each edge of the chip 102,204,300, thereby forming a frame or stiffening adhesive 202 around the center portion of the chip 102,204,300. The chip includes one or more dies (e.g., dies 302*a-e*) including blocks of semiconductive material such as silicon onto which functional circuitry is fabricated. In some implementations, the dies are surrounded by a portion of encapsulant 304, such as polyamide or another molding material that fixes the dies in place. Accordingly, in such implementations, the stiffening adhesive 202 is applied to a portion of the encapsulant 304 defining a periphery of the chip 102,204,300. The stiffening adhesive 202 is an adhesive that, once cured, forms a hardened or rigid bond between components, such as one or more chips 102,204,300 and a lid 106.

The method of FIG. 4 also includes applying 404, to the center portion of the chip 102,204,300, a thermal interface material 110. The thermal interface material 110 is a thermally conductive material that fills air gaps between the chip 102,204,300 and a lid 106 to be applied, thereby increasing thermal conductivity between the chip 102,204,300 and the lid 106. For example, the thermal interface material 110 includes a non-metal or non-metallic (e.g., not including any metal components) thermal interface material 110 such as a polymer thermal interface material 110. As an example, the thermal interface material 110 includes a thermal paste or thermal grease. The thermal interface material 110 is applied such that, after application, the stiffening adhesive 202 frames the applied thermal interface material 110. Although the method of FIG. 4 describes the thermal interface material 110 as being applied after the stiffening adhesive 202, one skilled in the art will appreciate that, in some implementations, the stiffening adhesive 202 is applied after the thermal interface material 110. One skilled in the art will appreciate that, in some implementations, the stiffening adhesive 202 and thermal interface material 110 are applied substantially simultaneously.

The method of FIG. 4 also includes applying 406 a lid 106 to the chip 102,204,300. As an example, the lid 106 is applied to cover or enclose the chip 102,204,300. In some implementations, the lid 106 is applied by bonding the lid 106 to a substrate 104 to which the chip 102,204,300 is bonded. For example, the lid 106 is bonded to the substrate 104 using an adhesive 108 or another approach for coupling the lid 106 to the substrate 104.

The method of FIG. 4 also includes curing 408 the stiffening adhesive 202. For example, in some implementations, curing 408 the stiffening adhesive 202 is performed by waiting some amount of time for chemical reactions in the stiffening adhesive 202 (e.g., through mixing multicomponent adhesives prior to application). In some implementations, curing the stiffening adhesive 202 includes applying heat, a chemical agent, or other external agent to the stiffening adhesive 202. Curing 408 the stiffening adhesive 202 causes the stiffening adhesive 202 to harden, thereby forming a hardened and rigid bond between the chip 102,204,300 and the lid 106. Thus, the cured stiffening adhesive 202 provides structural support for the chip 102,204,300 and the lid 106, preventing any delamination caused by heat expansion during operation of a device or apparatus including the chip 102,204,300.

Figure 5:
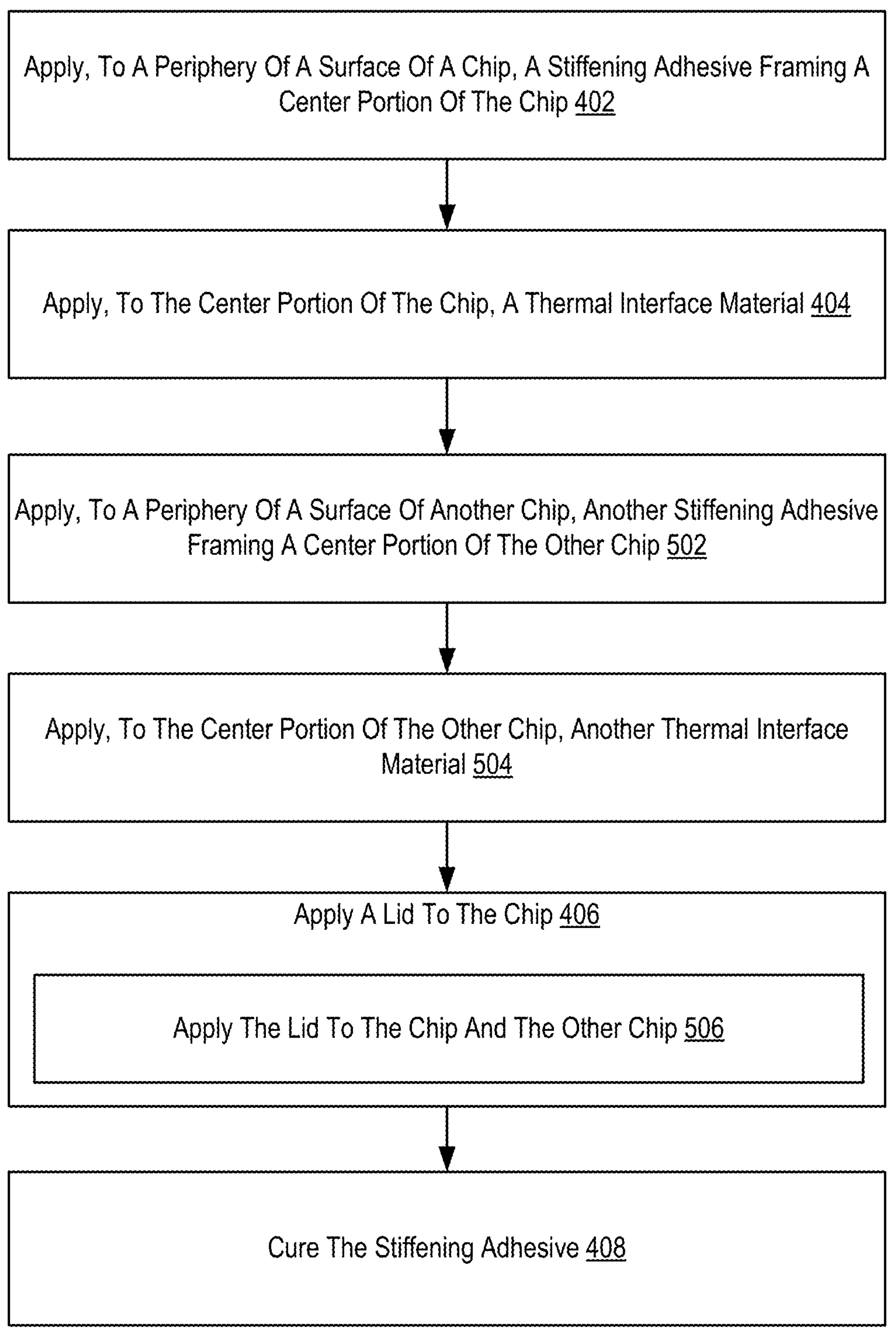
FIG. 5 is a flowchart of another example method for structural thermal interfacing for lidded semiconductor packages according to some implementations.

For further explanation, FIG. 5 sets forth a flow chart illustrating an example method for structural thermal interfacing for lidded semiconductor packages according to some implementations of the present disclosure. The method of FIG. 5 is similar to FIG. 4 in that the method of FIG. 5 includes applying 402, to a periphery of a surface of a chip (e.g., a chip 102,204,300) a stiffening adhesive 202 framing a center portion of the chip; applying 404, to the center portion of the chip 102,204,300, a thermal interface material 110; applying 406 a lid 106 to the chip 102,204,300; and curing 408 the stiffening adhesive 202.

The method of FIG. 5 differs from FIG. 4 in that the method of FIG. 5 includes applying 502, to a periphery of a surface of another chip 102,204,300, another stiffening adhesive 202 framing a center portion of the other chip 102,204,300. For example, in some implementations, the chip 102,204,300 and another chip 102,204,300 are bonded to a same substrate 104. In some implementations, the stiffening adhesive 202 applied to the other chip 102,204,300 is a same type of stiffening adhesive 202 applied to the first chip 102,204,300. In other implementations, different stiffening adhesives 202 are applied to the chip 102,204,300 and the other chip 102,204,300. In some implementations, the stiffening adhesive 202 is applied to the other chip 102,204,300 by being applied to an encapsulant 304 encapsulating multiple dies of the other chip 102,204,300.

The method of FIG. 5 also includes applying 502, to the center portion of the other chip 102,204,300, another thermal interface material 110. Thus, each chip 102,204,300 includes a portion of stiffening adhesive 202 framing a respective center portion and a portion of thermal interface material 110 framed by the stiffening adhesive 202.

The method of FIG. 5 further differs from FIG. 4 in that applying 406 the lid 106 to the chip 102,204,300 includes applying 506 the lid 106 to the chip 102,204,300 and the other chip 102,204,300. Thus, both chips 102,204,300 are each bonded to the lid 106 using respective portions of stiffening adhesive 202 framing portions of thermal interface material 110.

In view of the explanations set forth above, readers will recognize that the benefits of structural thermal interfacing for lidded semiconductor packages include:

Improved performance of a computing system by resisting delamination due to heat-induced deformation of semiconductor packages.

It will be understood from the foregoing description that modifications and changes can be made in various implementations of the present disclosure. The descriptions in this specification are for purposes of illustration only and are not to be construed in a limiting sense. The scope of the present disclosure is limited only by the language of the following claims.

What is claimed is:

1. A semiconductor package for structural thermal interfacing for lidded semiconductor packages, comprising:
- a substrate;
- a chip bonded to the substrate; and
- a lid, wherein the lid is bonded to the chip by a stiffening adhesive contacting a top surface of the chip and in a pattern that frames a center portion of the chip, and wherein the lid is thermally coupled to the chip by a thermal interface material.

2. The semiconductor package of claim 1, wherein the thermal interface material comprises a non-metallic thermal interface material.

3. The semiconductor package of claim 2, wherein the thermal interface material comprises a polymer thermal interface material.

4. The semiconductor package of claim 1, wherein the stiffening adhesive forms a rigid frame around the center portion of the chip.

5. The semiconductor package of claim 1, wherein the lid is bonded to the substrate by another adhesive.

6. The semiconductor package of claim 1, wherein the thermal interface material is in contact with the stiffening adhesive.

7. The semiconductor package of claim 1, wherein the stiffening adhesive has been cured.

8. The semiconductor package of claim 1, wherein the stiffening adhesive is applied to a fewer than all sides of a periphery of the chip.

9. An apparatus for structural thermal interfacing for lidded semiconductor packages, comprising:
- computer memory;
- a chip operatively coupled to the computer memory; and
- a lid, wherein the lid is bonded to the chip by a stiffening adhesive contacting a top surface of the chip and in a pattern that frames a center portion of the chip, and wherein the lid is thermally coupled to the chip by a thermal interface material.

10. The apparatus of claim 9, wherein the thermal interface material comprises a non-metallic thermal interface material.

11. The apparatus of claim 10, wherein the thermal interface material comprises a polymer thermal interface material.

12. The apparatus of claim 9, wherein the stiffening adhesive forms a rigid frame around the center portion of the chip.

13. The apparatus of claim 9, wherein the lid is bonded to the computer memory by another adhesive.

14. The apparatus of claim 9, wherein the thermal interface material is in contact with the stiffening adhesive.

15. The apparatus of claim 9, wherein the stiffening adhesive has been cured.

16. The apparatus of claim 9, wherein the stiffening adhesive is applied to a fewer than all sides of a periphery of the chip.

* * * * *